United States Patent [19]

Anderson

[11] Patent Number: 5,432,693
[45] Date of Patent: Jul. 11, 1995

[54] DIGITAL PULSE WIDTH MODULATOR CIRCUIT WITH PROPORTIONAL DITHER

[75] Inventor: Robert L. Anderson, Saline, Mich.

[73] Assignee: Ford Motor Company, Dearborn, Mich.

[21] Appl. No.: 41,361

[22] Filed: Apr. 1, 1993

[51] Int. Cl.⁶ .............................................. G05F 1/575
[52] U.S. Cl. .................................... 363/41; 323/283
[58] Field of Search ............... 323/282, 283, 284, 351; 363/41

[56] References Cited

U.S. PATENT DOCUMENTS

| | | | |
|---|---|---|---|
| 3,970,919 | 7/1976 | Butcher | 323/19 |
| 4,988,942 | 1/1991 | Ekstrand | 323/282 |
| 5,079,498 | 1/1992 | Cleasby et al. | 323/283 |

Primary Examiner—Thomas M. Dougherty
Assistant Examiner—Shawn Riley
Attorney, Agent, or Firm—Roger L. May; Peter Abolins

[57] ABSTRACT

System and method for digitally generating a pulse width modulated (PWM) signal with dither based on a command signal, the signal having a pulse width proportional to the command signal. In the preferred embodiment, the PWM signal with proportional dither energizes a load, such as a variable force solenoid, with a desired electrical current. The system includes a base signal generator for generating a base signal having a pulse width which is based on a command signal representing the desired electrical current. The system also includes a dither signal generator for digitally generating a dither signal having a pulse width proportional to the command signal, and a summer for combining the base signal and the dither signal to obtain the pulse width modulated signal with proportional dither.

7 Claims, 6 Drawing Sheets

DIGITAL PULSE WIDTH MODULATOR CIRCUIT WITH PROPORTIONAL DITHER

TECHNICAL FIELD

The present invention relates to pulse width modulated signals for driving solenoids and, more particularly, to proportional low frequency modulated signals for driving solenoids.

BACKGROUND ART

Many existing vehicular control modules include an analog driver circuit, frequently referred to as the variable force solenoid (VFS) driver circuit, used in conjunction with automatic transmission variable force solenoids. In some embodiments, the VFS driver is a separate analog integrated circuit located apart from the digital input/output (I/O) chip. As is known, the analog driver circuit essentially provides a variable duty cycle output signal to the solenoid, in response to a binary command word from a microprocessor. For example, the pulse width modulated (PWM) signal may have a range of 5-15 kHz with about 5%-95% duty cycle. Typically, the duty cycle is 5%-55%.

Fixed PWM has associated problems, because of hysteresis effects in the solenoid. To remedy this problem, and to improve linearity, a "dither" signal is added to the PWM signal. For example, the VFS driver circuit typically adds a low frequency (e.g. 200 Hz) signal that is approximately 10% of the desired solenoid current.

U.S. Pat. No. 5,079,498, issued to Cleasby et al., discloses a combination analog/digital (i.e. hybrid) PWM generator with dither for current control. The reference teaches the use of analog circuits and digital circuits to generate a square wave PWM voltage drive to a load. The resulting current is sensed and a corresponding voltage is fedback and compared with two zone boundary voltage levels, which are spaced equally above and below a signal representing the desired output current. Based on the comparison (i.e. when the voltage feedback reaches either boundary level), a switching circuit is switched from ON to OFF. When dither is incorporated, the zone width is based on stored half-zone width values which are selected based on the dither phase. The Cleasby et al. reference however, does not teach use of an entirely digital circuit to generate a dither signal that is proportional to the desired output signal.

As future generation vehicular control modules are developed and control of the vehicle operation becomes more precise, the number of VFS driver circuits required is expected to increase. Additionally, the trend in future generation controllers is to employ all digital I/O chips. Continued use of conventional analog solenoid drivers, and hybrid drivers such as that described in the '498 reference, will present problems due to the difficulty of mixing analog and digital technology on the same silicon. If a conventional digital PWM channel is used to drive the VFS solenoid with the dither being provided by the microprocessor, the microprocessor will be burdened with a large overhead, considering the 200 Hz modulation and number of channels required to drive the solenoids.

It is, therefore, desirable to utilize a system which provides a PWM signal implemented entirely in digital circuitry and generated without microprocessor intervention. It is also desirable to utilize a system which provides a PWM signal with low frequency modulation dither that is proportional to the desired output signal.

DISCLOSURE OF THE INVENTION

It is, therefore, an object of the present invention to provide a digital pulse width modulator for generating a pulse width modulated signal with proportional dither.

In carrying out the above object, and other objects and features of the present invention, there is provided a system for digitally generating a pulse width modulated signal with proportional dither for energizing a load with a desired electrical current. The system comprises base signal generating means for digitally generating a base signal having a pulse width based on a command signal representing the desired electrical current. The system also comprises dither signal generating means for digitally generating a dither signal having a pulse width proportional to the command signal, and summing means for combining the base signal and the dither signal to obtain the pulse width modulated signal with proportional dither.

In a preferred construction, the dither signal generating means comprises dither counting means for digitally generating a dither signal having a predetermined pulse width and proportioning means, in electrical communication with the dither counting means, for digitally controlling the counting means to proportion the pulse width of the dither signal to the command signal.

A method is also provided for use with the system.

The advantages accruing to the present invention are numerous. Since the digital pulse width modulator with proportional dither is implemented entirely in digital circuitry,.problems of mixing analog and digital circuitry on the same silicon are obviated. Additionally, problems associated with analog circuitry, such as drift caused by component characteristic variations due to temperature, are minimized. Still further, use of a dither signal having a pulse width proportional to the desired output signal further improves the linearity of the input command and force generated transfer function of the solenoid.

The above object and other objects, features and advantages of the present invention will be readily appreciated by one of ordinary skill in the art from the following detailed description of the best mode for carrying out the invention when taken in connection with the accompanying drawings.

BEST MODE FOR CARRYING OUT THE INVENTION

Figure 1:
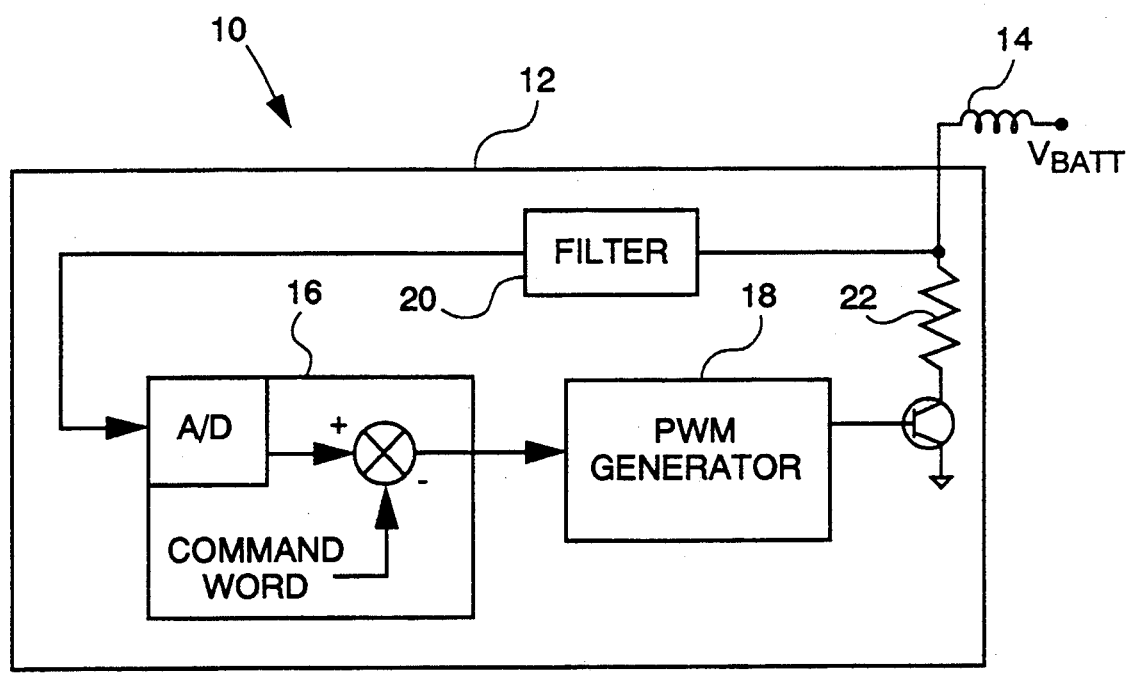
FIG. 1 is a block diagram of a system utilizing the digital pulse width modulator with proportional dither of the present invention.

Referring now to FIG. 1, there is illustrated a block diagram of a system 10 incorporating the digital pulse width modulator with proportional dither of the present invention. As shown, the system 10 includes a vehicular electronic engine control (EEC) module, shown generally by reference numeral 12, for controlling the energization of a load, such as a variable force solenoid (VFS) 14. As shown, the control module 12 implements a closed-loop feedback system utilizing a microprocessor 16, a digital pulse width modulator with proportional dither circuit 18, a low-pass or averaging filter 20 and a sense resistor 22.

As described in greater detail below, the digital pulse width modulator (PWM) circuit 18 generates a PWM signal based on a digitized command word representing a desired or commanded value of solenoid current. The PWM signal preferably has a pulse width which is proportional to the command word. The voltage across sense resistor 22, which is proportional to the current in the VFS solenoid, is filtered and fedback to an analog-to-digital (A/D) converter in the microprocessor 16. The digitized value is compared to the command word, which could be generated by another microprocessor not specifically illustrated. The difference between the actual current and the desired current is then used to adjust the command word, so as to produce the exact value of solenoid current desired. With a control bandwidth of about 5–10 Hz, this is well within microprocessor and software control capability.

Figure 2:
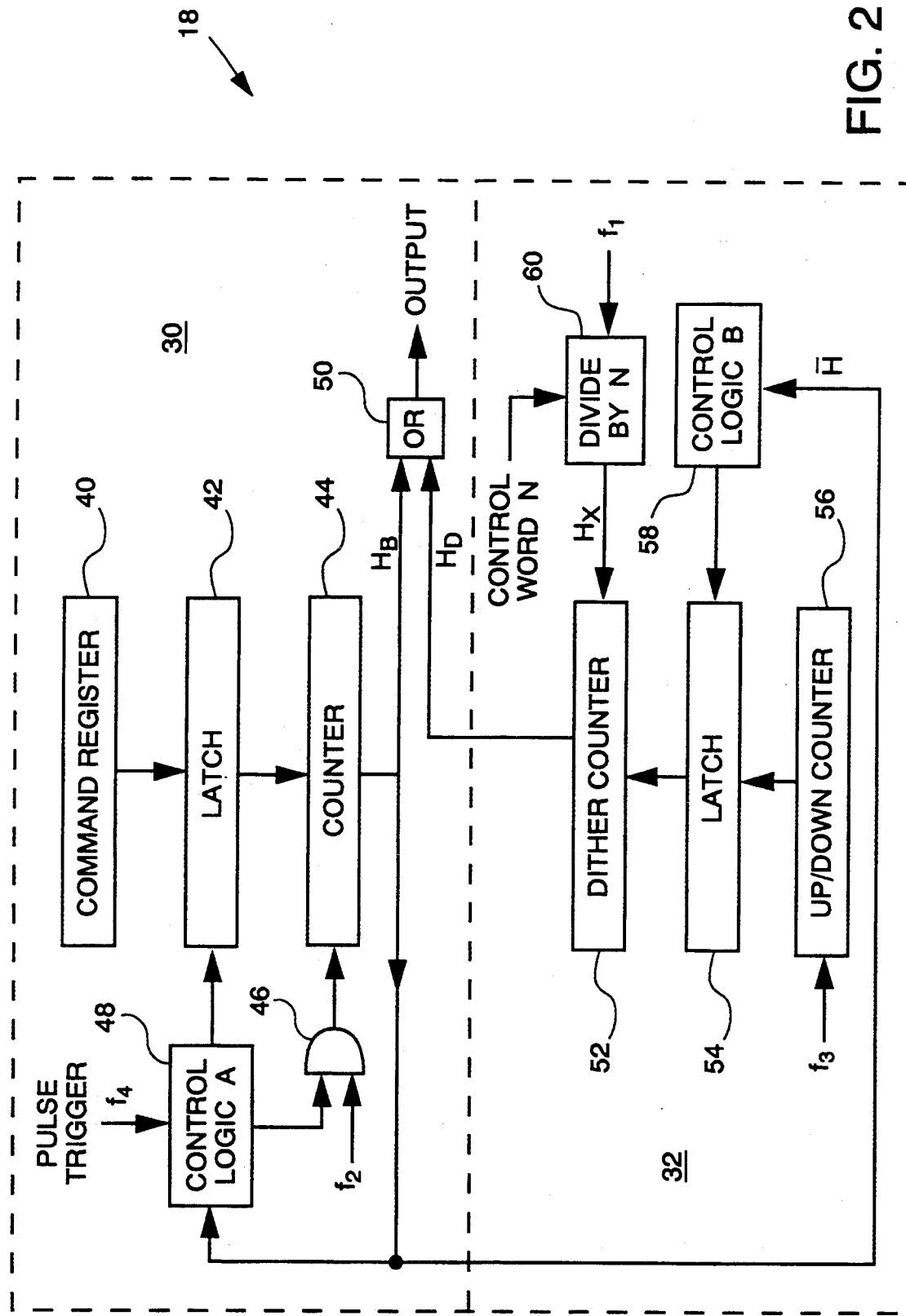
FIG. 2 is a schematic block diagram of the modulated PWM circuit block shown in FIG. 1.
Figure 3:
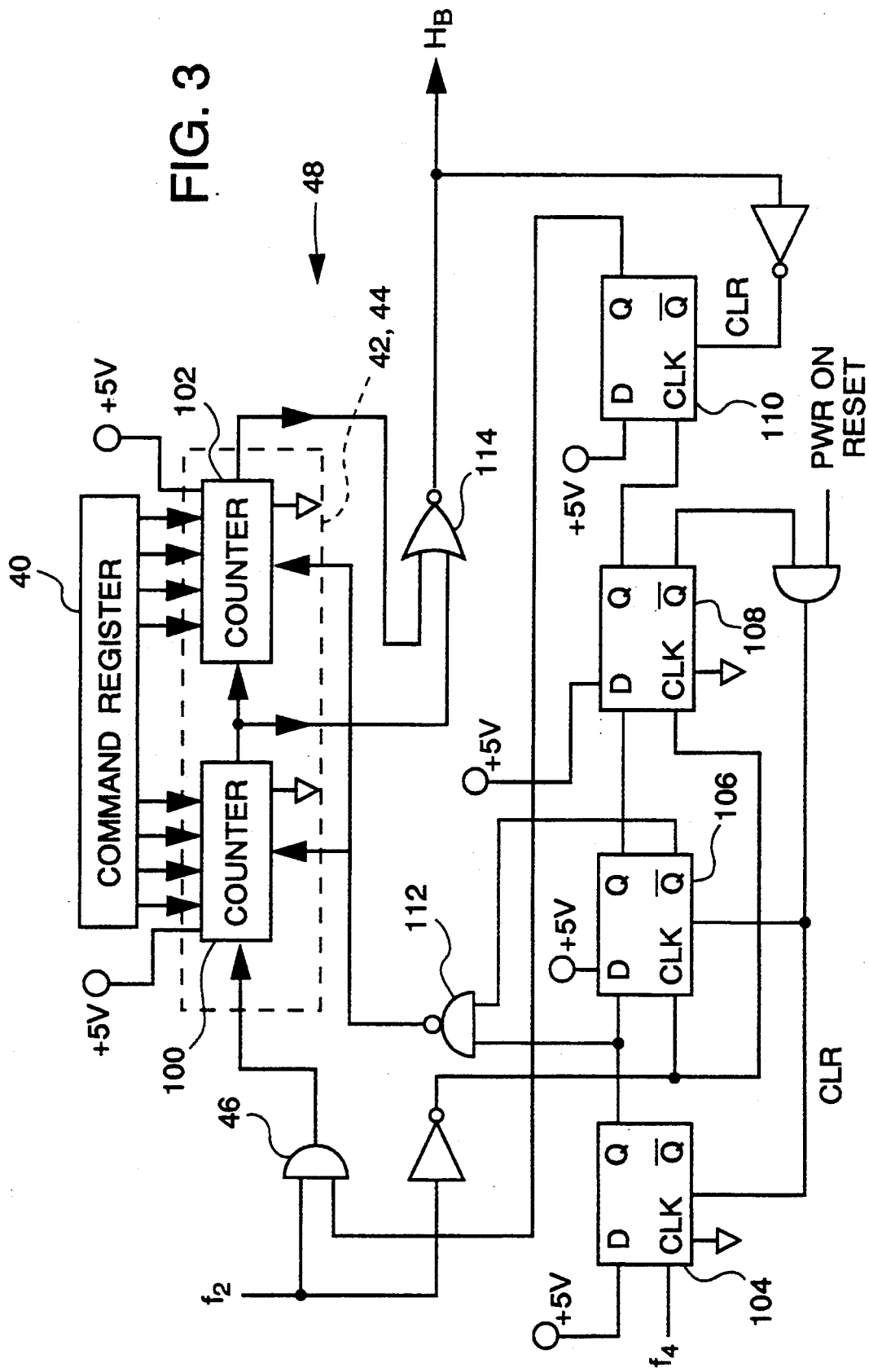
FIG. 3 is a detailed schematic block diagram of the base pulse generator block of the present invention shown in FIG. 2.
Figure 4:
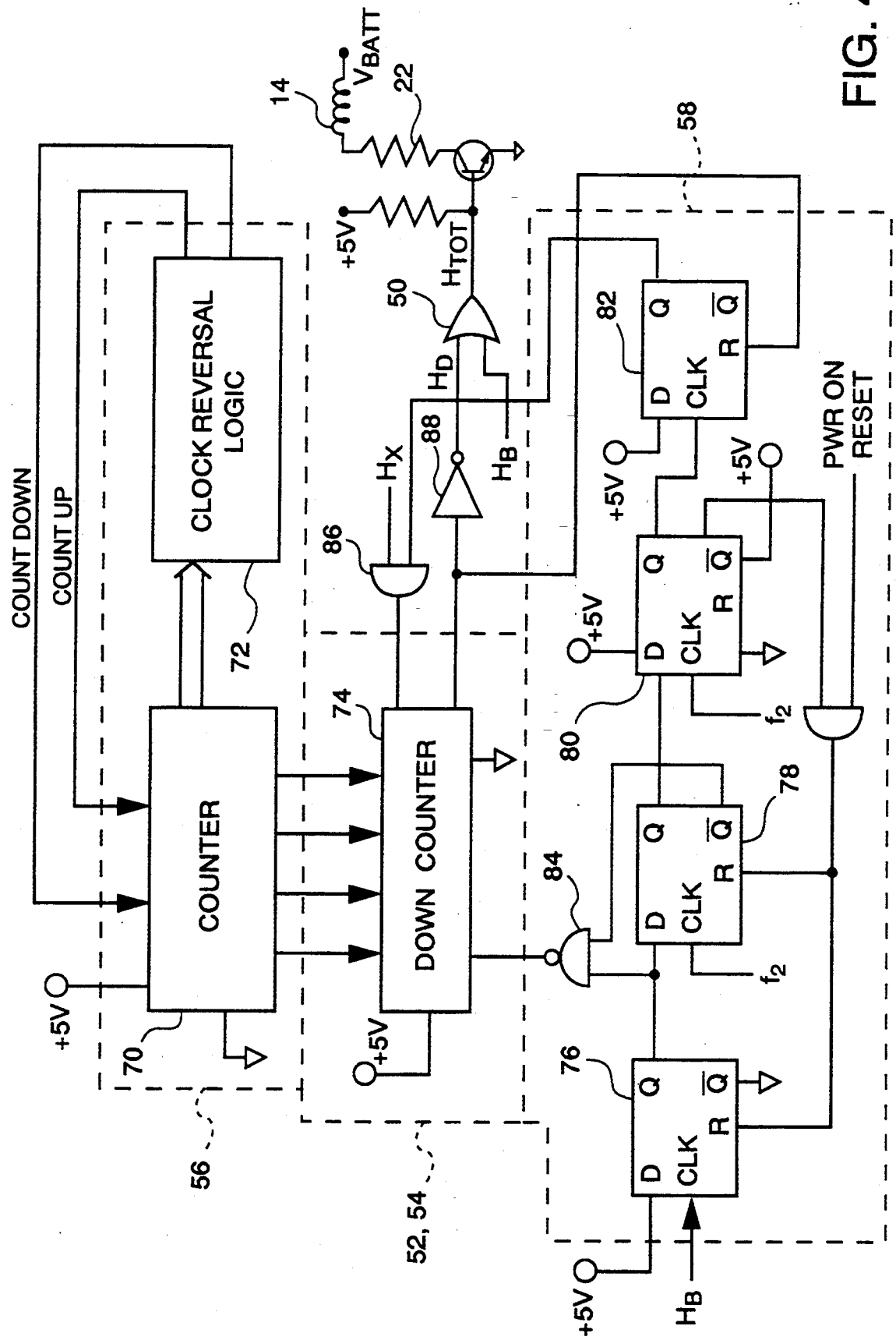
FIG. 4 is a detailed schematic block diagram of the dither pulse generator block of the present invention shown in FIG. 2.

Referring now to FIG. 2, there is illustrated a more detailed block diagram of the pulse width modulator with proportional dither circuit 18 shown in FIG. 1. In the preferred embodiment, the circuit 18 includes a base pulse generator shown generally by reference numeral 30 and a dither pulse generator shown generally by reference numeral 32. FIG. 3 illustrates a schematic block diagram of the base pulse generator 30, and FIG. 4 illustrates a schematic block diagram of the dither pulse generator 32. In the preferred embodiment, the base pulse generator 30 generates a base pulse width modulated signal ($H_B$), and the dither pulse generator generates a low-frequency dither signal ($H_D$) having a pulse width proportional to the desired output. These signals are then combined with an OR gate shown by 50 to obtain a total pulse width for energizing the solenoid.

As shown in FIG. 2, the base pulse generator 30 and dither pulse generator 32 utilize a plurality of signals ($f_1$–$f_4$) obtained from an oscillator and appropriate divider circuits not specifically illustrated. In one preferred embodiment, a first signal ($f_1$) having a frequency of about 20.6 MHz is obtained from an oscillator; a second signal ($f_2$) having a frequency of about 1.28 MHz is obtained from a first divider; a third signal ($f_3$) having a frequency of about 6.4 kHz is obtained from a second divider; and a fourth signal ($f_4$) having a frequency of about 5 kHz is obtained from a third divider. Such dividers are well known in the art.

With combined reference now to FIGS. 2 and 3, the base pulse generator will now be discussed. The base pulse generator 30 includes a command register 40, a latch 42, a down counter 44, a clock gate 46 and control logic 48. As best shown in FIG. 3, the latch 42 and the counter 44 are implemented utilizing 4-bit binary, synchronous, reversible (i.e up/down) counters 100 and 102, such as part number SN74191, commercially available from Texas Instruments, Dallas, Tex., United States of America. Of course, functionally similar devices from other manufactures could be utilized. In the preferred embodiment, the counters 100 and 102 are configured as down counters.

With continuing reference to FIG. 3, the control logic 48 is implemented utilizing a plurality of D-type edge-triggered flip-flops 104–110, such as part number SN7474, commercially available from Texas Instruments. As is known, input information is to the outputs on the positive edge of the clock pulse. The frequency divider chain provides signal $f_4$ as the clock pulse for the flip-flop 104, whereas signal $f_1$ is provided as the clock pulse for the flip-flops 106 and 108. The flip-flop 108 provides the clock pulse for flip-flop 110. The outputs of flip-flops 104 and 106 are provided to a NAND gate 112, the output of which is electrically connected to the counters 100 and 102 to load the counters with the command word. This configuration allows the counters to be continuously loaded with the command word at a rate based on the signal $f_4$. The control logic 48 is preferably designed to allow immediate retriggering of the cycle if the base pulse width plus the dither pulse width exceed the trigger pulse frequency, i.e. if a 100% duty cycle is exceeded. Since the duty cycle of the counter 44 is always ≦100%, a new pulse on clock line of flip-flop 104 will load and restart time out cycle.

With continuing reference to FIG. 3, the clock pulse for the counter 100 is provided by the clock gate 46, the output of which is governed by signal $f_2$ (at 1.28 Mhz) and by the output of flip-flop 110. As best shown in FIG. 3, the counters 100 and 102 are cascaded to implement parallel enabling, such that the output of counter 100 is the clocking signal for counter 102. It should be noted that the counters 100 and 102 are configured so as to produce a high-level output pulse while the counter is counting down. The outputs of the counters are then combined with a NOR gate 114, to produce the signal $H_B$, which represents the base pulse width modulated signal. It should be appreciated that the signal $H_B$ has a pulse width which is based on the value of the command word.

In operation, a trigger pulse from the signal $f_4$ initiates the control logic 48. As a result, the 8-bit command word is provided to the latch 42. Of course, implementations utilizing a 16-bit, 24-bit, 32-bit command word and so on, are possible. On the appropriates signal from the control logic 48 (i.e. the signal from NAND gate 112 of FIG. 3) the down counter 44 is preloaded with the command word. The clock gate 46 activates the counter 44 which counts down from the command word, generating the base signal ($H_B$) which has a pulse width based on the value of the command word. When the counter 44 times out, the dither pulse generator 32, described below, is triggered. As best shown in FIG. 3, flip-flop 110 is also reset, stopping the counter by setting one input of gate 46 to zero.

Referring now to FIGS. 2 and 4, the dither pulse generator 32 will now be discussed. As best shown in FIG. 2, the dither pulse generator 32 includes a dither counter 52, a latch 54, an up/down counter 56, control logic 58 and a divide-by-N 60. As best shown in FIG. 4, the up/down counter 56 is implemented utilizing a 4-bit binary counter 70 and clock reversal logic 72. The counter 70, such as part number SN74193, commercially available from Texas Instruments, is configured to repeatedly count from binary zero to binary 15 and back, based on the Count Down and Count Up signals from the clock reversal logic 72.

Figure 5:
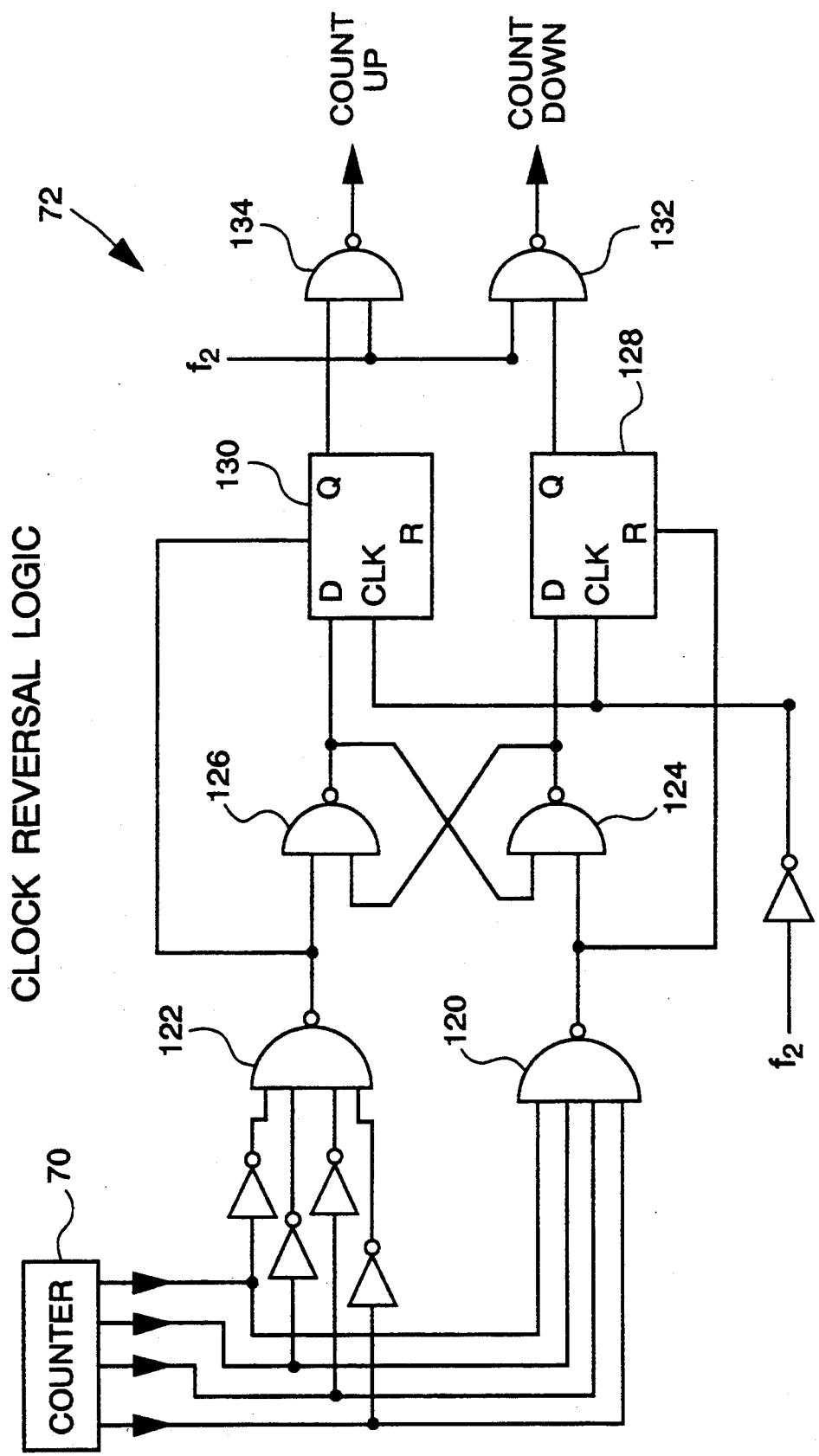
FIG. 5 is a detailed schematic block diagram of the clock reversal logic shown in FIG. 4.

FIG. 5 illustrates an implementation of the clock reversal logic 72 shown in FIG. 4. Noninverted data outputs of the up/down counter 70 are provided to the NAND gate 120, whereas inverted data outputs of the up/down counter 70 are provided to the NAND gate 122. The outputs of the NAND gates 120 and 122 are provided to NAND gates 124 and 126 configured as shown. The remainder of the clock reversal logic includes a pair of D-type flip-flops 128 and 130, and NAND gates 132 and 134, all of which are clocked by signal $f_2$, to produce the Count Up and Count Down signals. The direction of counting is determined by which count signal is pulsed while the other count signal is at a high level (i.e. binary 1). A low level signal on the output of NAND gate 122 indicates a count of zero, whereas a low level signal on the output of NAND 120 indicates a count of fifteen.

With reference again to FIGS. 2 and 4, the dither counter 52 and the latch 54 are preferably implemented utilizing a 4-bit reversible counter 74, such as the SN74191, configured to operate as a down counter. As best shown in FIG. 4, the data outputs of the up/down counter 70 are latched in the down counter 74, which counts down from the latched value upon receiving appropriated signals from the control logic 58 and the divide-by-N 60.

As shown in FIG. 4, the control logic 58 includes a plurality of D-type edge-triggered flip-flops 76-82, such as part number SN7474 flip-flops described above with reference to FIG. 3. As is known, input information is transferred to the outputs of the flip-flops on the positive edge of the clock pulse. In the preferred embodiment, the dither pulse generator 32 is triggered when the base pulse generator 30 times out. This is accomplished by providing the signal $H_B$ (the output of counter 44) as the clock pulse for the flip-flop 76. The signal $f_2$ is provided as the clock pulse for the flip-flops 78 and 80. The flip-flop 80 provides the clock pulse for flip-flop 82. The outputs of flip-flops 76 and 78 are provided to a NAND gate 84, the output of which is provided to the appropriate input of down counter 74 to load the outputs with the inputs from the up/down counter 70.

Figure 6:
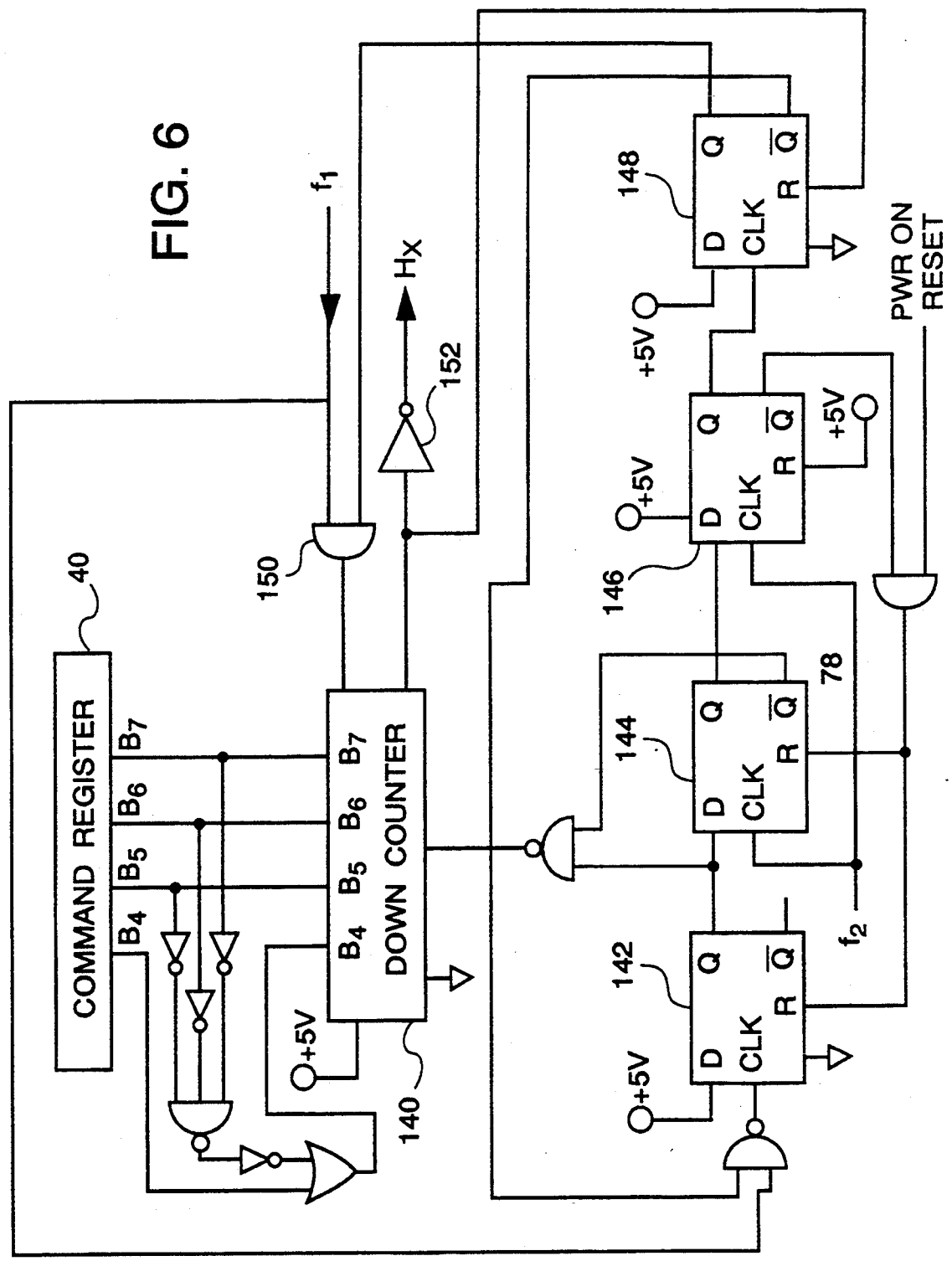
FIG. 6 is a detailed schematic block diagram of the divide-by-N logic shown in FIG. 2.

Referring now to FIG. 6, there is shown a schematic block diagram of the four bit divide-by-N 60 for use with the present invention. In the preferred embodiment, "N" represents the value of the command word. In general, the divide-by-N 60 produces a clock signal ($H_X$), the frequency of which is determined based on the command word and the signal $f_1$, for clocking the counter 74 of the dither pulse generator. As shown in FIG. 6, the divide-by-N 60 includes a down counter 140, such as the SN74191, and a plurality of flip-flops 142-148, such as part number SN7474 flip-flops. The upper four (4) bits of the command word are input to the down counter 140. The counter 140, when clock by signal $f_1$ through AND gate 150 and configured with the flip-flops as shown, produces a high-level output pulse while counting down. This output pulse is then preferably inverted by inverter 152 to obtain $H_X$. Thus, the output of the divide-by-N is the signal $H_X$ having a frequency based on the command word (i.e. $f_1/N$). It should be appreciated that the hardware enclosed in the dashed box shown generally by reference numeral 154 is particularly useful when the four most significant bits of the command register (B4-B7) are all at a low level, since N needs to be nonzero for the divide-by-N to function as desired.

Referring once again to FIG. 4, the signal $H_X$ from the divide-by-N 60 and the output of flip-flop 82 are combined by AND gate 86 and provided as a clocking input to the down counter 74. It should be noted that the down counter 74 is configured to produce the dither signal, which is a high-level signal (i.e. binary 1) when the counter is counting down. The dither pulse is then provided to the inverter 88, which inverts the dither pulse to obtain $H_D$.

It should be appreciated that since the down counter 74 is clocked based on $H_X$ from the divide-by-N 60, the divide-by-N provides a means for controlling the speed with which the down counter 74 counts down. The larger the command word, the smaller the frequency of $H_X$ and the slower the counter 74 counts down. Accordingly, the divide-by-N 60 provides a proportioning means for varying the width of the dither pulse $H_D$ proportionally to the command word (i.e. the desired output). Use of a dither signal having a pulse width proportional to the desired output signal results in advantages over existing solenoid energization schemes by improving the linearity of the input command and force generated transfer function of the solenoid.

With continuing reference to FIG. 4, once the base signal ($H_B$) and the dither signal ($H_D$) have been generated, they are logically combined by a NAND gate 50 to obtain a total PWM output signal ($H_{TOT}$) having a width equal to the sum of the base signal pulse width and the dither signal proportional pulse width. As shown, $H_{TOT}$ energizes a drive transistor electrically connected to the solenoid 14 through the sense resistor 22.

Figure 7:
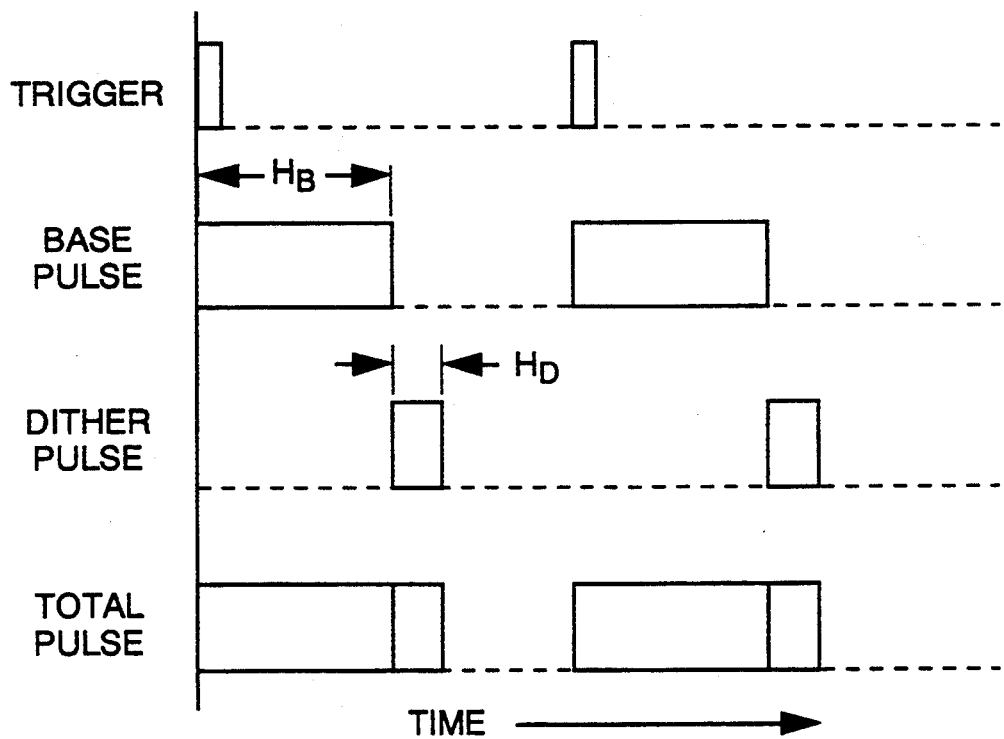
FIG. 7 is an illustration of various timing waveforms generated by the digital pulse width modulator with proportional dither of the present invention.

Referring now to FIG. 7, there is an illustration of the waveforms associated with the digital generation of a pulse width modulated signal with proportional dither of the present invention. More specifically, FIG. 7 illustrates the relation between the trigger pulse (i.e. $f_4$), the base signal $H_B$, the dither signal with proportional pulse width $H_D$ and the total PWM output signal $H_{TOT}$. As graphically shown, a base signal is generated by the base pulse modulator in response to each trigger pulse. The negative edge of the base signal triggers the dither pulse generator to generate a dither signal having a pulse width which varies proportionally to the desired output signal. The two pulse outputs are combined to produce a total pulse for energizing the variable force solenoid.

It is understood, of course, that while the form of the invention herein shown and described constitutes the preferred embodiment of the invention, it is not intended to illustrate all possible forms thereof. It will also be understood that the words used are words of description rather than limitation, and that various changes may be made without departing from the spirit and scope of the invention as disclosed.

I claim:

1. A system for digitally generating a pulse width modulated signal with proportional dither for energizing a load with a desired electrical current, the system comprising:
   a command register for storing a command signal;
   base counting means for receiving the command signal from the command register, the base counting means digitally generating a base signal having a pulse width based on the command signal, the pulse width of the base signal having a positive edge and a negative edge;

dither counting means responsive to the negative edge of the base signal for digitally generating a dither signal having a predetermined pulse width; and summing means for combining the base signal and the dither signal to obtain the pulse width modulated signal with proportional dither.

2. The system of claim 1 further comprising:

first control means for activating the base counting means to digitally generate the base signal; and second control means for activating the dither counting means based on a signal from the base counting means, the dither counting means digitally generating the dither signal having a pulse width proportional to the command signal.

3. The system of 1 wherein the command signal is an 8-bit command word, and wherein the dither signal pulse width is obtained based on the upper four bits of the command word.

4. The system of claim 1 further comprising:

proportioning means, in electrical communication with the dither counting means, for digitally controlling the counting means to proportion the pulse width of the dither signal to the command signal.

5. A method of digitally generating a pulse width modulated signal with proportional dither for energizing a load with a desired electrical current, the method comprising:

storing a command signal;

receiving the command signal and digitally generating a base signal having a predetermined pulse width based on a digitized command signal representing the desired electrical current;

in response to a negative edge of the pulse width of the base signal, digitally generating a dither signal having a pulse width proportional to the command signal; and summing the base signal and the dither signal to obtain the pulse width modulated signal with proportional dither.

6. The method of claim 5 wherein the load is a variable force solenoid, the method further comprising energizing the variable force solenoid with the pulse width modulated signal with proportional dither.

7. The method of claim 5 wherein the step of digitally generating a dither signal includes:

digitally generating a dither signal having a predetermined pulse width; and modifying the predetermined pulse width based on the command signal to obtain a pulse width proportional to the command signal.

* * * * *